(12) United States Patent
Park et al.

(10) Patent No.: US 9,082,871 B2
(45) Date of Patent: Jul. 14, 2015

(54) SUBSTRATE OF SEMICONDUCTOR PACKAGE AND METHOD OF FABRICATING SEMICONDUCTOR PACKAGE USING THE SAME

(71) Applicant: Samsung Electronics Co., Ltd., Suwon-si, Gyeonggi-do (KR)

(72) Inventors: Gi-Jun Park, Seoul (KR); Won-Keun Kim, Hwaseong-si (KR); Teak-Hoon Lee, Hwaseong-si (KR); Chang-Seong Jeon, Seongnam-si (KR); Young-Kun Jee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/619,155

(22) Filed: Feb. 11, 2015

(65) Prior Publication Data
US 2015/0155259 A1 Jun. 4, 2015

Related U.S. Application Data

(62) Division of application No. 13/900,612, filed on May 23, 2013, now Pat. No. 8,987,904.

(30) Foreign Application Priority Data

Jul. 9, 2012 (KR) ........................ 10-2012-0074542

(51) Int. Cl.
*H01L 23/00* (2006.01)
*H01L 21/56* (2006.01)
*H01L 23/498* (2006.01)
*H01L 21/673* (2006.01)
*H01L 23/48* (2006.01)
*H01L 21/50* (2006.01)

(52) U.S. Cl.
CPC ................ *H01L 24/81* (2013.01); *H01L 21/56* (2013.01); *H01L 21/50* (2013.01); *H01L 21/563* (2013.01); *H01L 21/673* (2013.01); *H01L 21/67346* (2013.01); *H01L 23/48* (2013.01); *H01L 23/49816* (2013.01)

(58) Field of Classification Search
CPC ....... H01L 21/56; H01L 21/563; H01L 21/58; H01L 21/50; H01L 2021/60022; H01L 21/673; H01L 21/67346; H01L 23/48; H01L 23/49816
See application file for complete search history.

(56) References Cited

U.S. PATENT DOCUMENTS

| | | | |
|---|---|---|---|
| 6,875,931 B2 | 4/2005 | Combs et al. | |
| 2007/0124924 A1* | 6/2007 | Nakamura | 29/830 |
| 2008/0265407 A1 | 10/2008 | Lu et al. | |
| 2009/0283302 A1 | 11/2009 | Lee et al. | |
| 2011/0180921 A1 | 7/2011 | Loiselet | |

FOREIGN PATENT DOCUMENTS

| | | |
|---|---|---|
| KR | 10-0225237 | 9/1998 |
| KR | 10-2000-0075058 | 12/2000 |
| KR | 10-0744151 | 9/2006 |

(Continued)

*Primary Examiner* — Peniel M Gumedzoe
(74) *Attorney, Agent, or Firm* — Ellsworth IP Group PLLC

(57) ABSTRACT

A substrate of a semiconductor package includes a first wiring substrate having a first surface and a second surface facing each other, the first surface having a semiconductor chip mounted thereon, a first support carrier, and an adhesive film connecting the second surface and the first support carrier.

10 Claims, 12 Drawing Sheets

(56) References Cited

FOREIGN PATENT DOCUMENTS

| KR | 10-2007-0083021 | 8/2007 |
| KR | 10-0897668 | 3/2009 |
| KR | 10-1009107 | 4/2010 |
| KR | 10-1044105 | 5/2011 |

* cited by examiner

SUBSTRATE OF SEMICONDUCTOR PACKAGE AND METHOD OF FABRICATING SEMICONDUCTOR PACKAGE USING THE SAME

CROSS-REFERENCE TO RELATED APPLICATIONS

This application is a Divisional of prior application Ser. No. 13/900,612, filed on May 23, 2013, in the United States Patent and Trademark Office, which claims priority under 35 U.S.C. §119(a) from Korean Patent Application No. 10-2012-0074542 filed on Jul. 9, 2012 in the Korean Intellectual Property Office, the contents of which in its entirety are herein incorporated by reference.

BACKGROUND

1. Field

The present general inventive concept relates generally to a substrate of a semiconductor package and a method of fabricating a semiconductor package using the same.

2. Description of the Related Art

Due to recent designs of smaller and slimmer semiconductor products using semiconductor packages, there is a corresponding requirement to design the semiconductor packages to also be smaller and slimmer. In order to design the semiconductor packages to be slimmer, a circuit board used in the semiconductor package has been designed to be slimmer, resulting in the semiconductor package becoming warped (i.e., misshapen). Since the warping of the semiconductor package has a major impact on a semiconductor device's functionality, various methods of reducing or eliminating the warping of the semiconductor package are being pursued.

SUMMARY

The present general inventive concept provides a substrate of a semiconductor package, which can prevent or relieve an occurrence of a contact failure between a semiconductor chip and the semiconductor package substrate during fabrication of a semiconductor package by increasing a thickness of the semiconductor package used in the semiconductor package process.

The present general inventive concept also provides a method of fabricating a method a semiconductor package using the substrate for a semiconductor package.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing a substrate of a semiconductor package, the substrate including a first wiring substrate having a first surface and a second surface facing each other, the first surface having a semiconductor chip mounted thereon, a first support carrier, and an adhesive film to connect the second surface and the first support carrier.

The first support carrier may be a second wiring substrate, the second wiring substrate may have a third surface and a fourth surface facing each other, and the adhesive film may connect the second surface and the fourth surface.

The third surface may have a semiconductor chip mounted thereon.

The substrate may further include an external terminal disposed on at least one surface of the second surface and the fourth surface.

The first wiring substrate and the second wiring substrate may have the same thickness.

The substrate may further include a second support carrier between the first wiring substrate and the second wiring substrate.

The adhesive film may include an upper adhesive film and a lower adhesive film, the upper adhesive film may connect the second surface and the second support carrier, and the lower adhesive film may connect the fourth surface and the second support carrier.

The adhesive film may further include a separator film and the separator film divides the adhesive film into two parts.

The first wiring substrate may be a multi-layered wiring substrate.

The foregoing and/or other features and utilities of the present general inventive concept may also be achieved by providing a method of fabricating a semiconductor package, the method including providing a substrate for a semiconductor package, comprising a first wiring substrate having a first surface and a second surface facing each other, the first surface having a semiconductor chip mounted thereon, a second wiring substrate having a third surface and a fourth surface facing each other, and an adhesive film connecting the second surface and the fourth surface, mounting a first semiconductor chip on the first surface, mounting a second semiconductor chip on the third surface, and separating the first wiring substrate and the second wiring substrate having the first semiconductor chip and the second semiconductor chip mounted thereon.

The method may further include forming a first molding member surrounding the first semiconductor chip between the mounting of the first semiconductor chip and the mounting of the second semiconductor chip.

The method may further include forming a second molding member surrounding the second semiconductor chip between the mounting of the second semiconductor chip and the separating of the first wiring substrate and the second wiring substrate from each other.

The method may further include a second upper molding member surrounding the second semiconductor chip after the separating of the first wiring substrate and the second wiring substrate from each other.

The method may further include a second lower molding member filling a portion between the second semiconductor chip and the third surface between the mounting of the second semiconductor chip and the separating of the first wiring substrate and the second wiring substrate from each other.

The adhesive film may further include a separator film, and the separating of the first wiring substrate and the second wiring substrate from each other may include separating the adhesive film into a first region and a second region with respect to the separator film.

The foregoing and/or other features and utilities of the present general inventive concept may also be achieved by providing a substrate of a semiconductor package, the substrate including a first wiring substrate having a first surface and a second surface facing each other, a second wiring substrate having a third surface and a fourth surface facing each other, an adhesive film to connect the second surface to the fourth surface, and a support carrier disposed between the second surface and the fourth surface to prevent warping of the semiconductor package during fabrication.

The adhesive film may include an upper adhesive film, and a lower adhesive film separated from the upper adhesive film by the support carrier.

The substrate may further include a first semiconductor chip mounted on the first surface, and a second semiconductor chip mounted on the third surface.

The substrate may further include at least one of a fixing film and at least one solder ball to couple at the first semiconductor chip to the first wiring substrate.

The first wiring substrate may be detached from the second wiring substrate at a completion of the fabrication.

BRIEF DESCRIPTION OF THE DRAWINGS

The above and other features and advantages of the present invention will become more apparent by describing in detail preferred embodiments thereof with reference to the attached drawings in which.

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
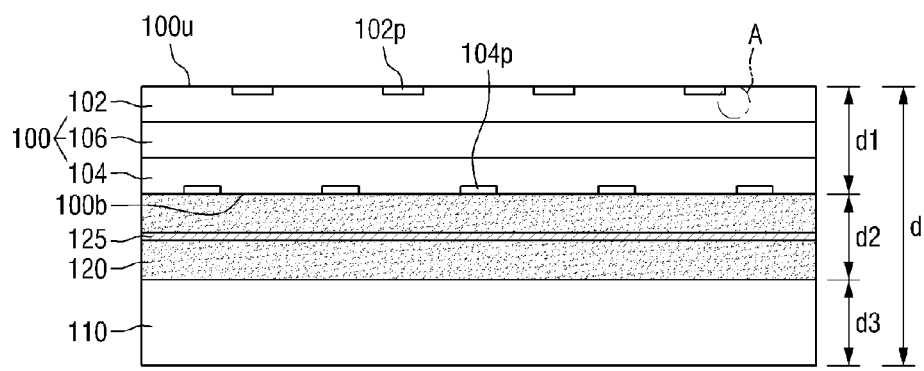
FIG. 1A is a side view illustrating a substrate of a semiconductor package according to an exemplary embodiment of the present general inventive concept and FIG. 1B is an enlarged view of an 'A' portion of FIG. 1A.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a substrate of a semiconductor package according to an exemplary embodiment of the present general inventive concept will be described with reference to FIGS. 1A through 2.

Figure 1B:
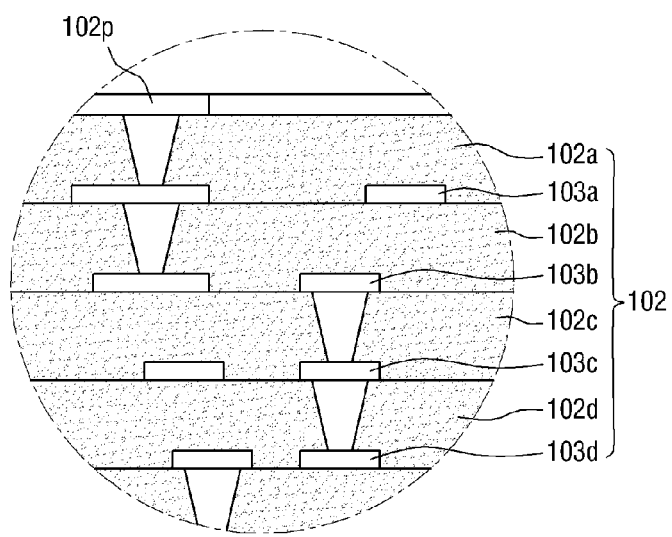
Figure 2:
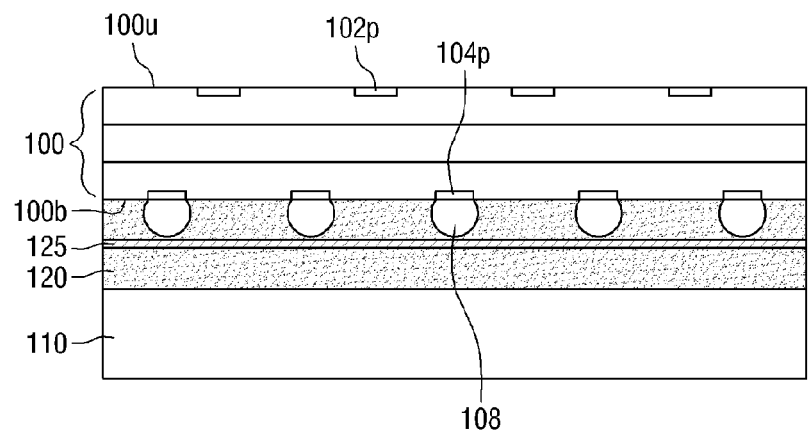
FIG. 2 is a side view illustrating a modified example of the substrate of a semiconductor package illustrated in FIG. 1A.

FIG. 1A is a side view illustrating a substrate 10 of a semiconductor package according to an exemplary embodiment of the present general inventive concept and FIG. 1B is an enlarged view of an 'A' portion of FIG. 1A, and FIG. 2 is a side view illustrating a substrate 12 as being a modified version of the substrate 10 of the semiconductor package illustrated in FIG. 1A.

Referring to FIGS. 1A and 1B, the substrate 10 according to an exemplary embodiment of the present general inventive concept includes a first wiring substrate 100, a first support carrier 110 and an adhesive film 120.

In detail, the first wiring substrate 100 includes a first surface 100u and a second surface 100b facing each other. In the first wiring substrate 100, the first surface 100u may be, for example, a surface on which a semiconductor chip is mounted, and the second surface 100b may be, for example, a surface on which an external terminal electrically connected to an external power supply is disposed. The first wiring substrate 100 may have, for example, a rectangular plane.

The first wiring substrate 100 may be a substrate including wiring formed therein to mount the semiconductor chip, and examples thereof may include a printed circuit board (PCB), a ceramic substrate, etc., but is not limited thereto. In the following description, exemplary embodiments of the present general inventive concept will be described with regard to, but not limited thereto, a printed circuit board (PCB) as the first wiring substrate 100. The first wiring substrate 100 may be, for example, a single-sided PCB, a double-sided PCB, or a multi-layered PCB. The first wiring substrate 100 may be, for example, a through hole PCB or a non-through hole PCB. In addition, the first wiring substrate 100 may be, for example, a rigid PCB or a flexible PCB. The first wiring substrate 100 may be made of, for example, paper phenol, glass epoxy, polyamide, polyester or molded plastic, but is not limited thereto. The first wiring substrate 100 may be formed by, for example, an etched foil process or an addictive process.

The first wiring substrate 100 may include a first core insulation film 106, a first upper stacked structure 102 and a first lower stacked structure 104. The first upper stacked structure 102 may be disposed on one surface of the first core insulation film 106, and the first lower stacked structure 104 may be disposed on another surface of the first core insulation film 106. For example, the first core insulation film 106 may include a via (not illustrated) electrically connecting the first lower stacked structure 104 and the first upper stacked structure 102. The first core insulation film 106 may be made of, for example, an epoxy-based resin including a glass filler, ceramic powder, etc. therein.

A surface of the first upper stacked structure 102 not contacting the first core insulation film 106 may be, for example, a first surface 100*u* of the first wiring substrate 100. A surface of the first lower stacked structure 104 not contacting the first core insulation film 106 may be, for example, a second surface 100*b* of the first wiring substrate 100. The first surface 100*u* of the first wiring substrate 100 may be a surface on which a semiconductor chip is mounted. Thus, a first bonding finger 102*p* electrically connected to the semiconductor chip may be disposed on the first surface 100*u*. That is, the first upper stacked structure 102 includes the first bonding finger 102*p*. Since an external terminal is disposed on the second surface 100*b* of the first wiring substrate 100, the first terminal pad 104*p* electrically connected to the external terminal may be disposed on the second surface 100*b*. That is, the first lower stacked structure 104 includes a first terminal pad 104*p*.

Referring to FIGS. 1A and 1B, the first upper stacked structure 102 may include, for example, a plurality of upper conductive patterns 103*a*, 103*b*, 103*c* and 103*d* and a plurality of upper insulation films 102*a*, 102*b*, 102*c* and 102*d* disposed between each of the upper conductive patterns 103*a*, 103*b*, 103*c* and 103*d*. The plurality of upper conductive patterns 103*a*, 103*b*, 103*c* and 103*d* may include, for example, copper (Cu), aluminum (Al), silver (Ag), gold (Au), nickel (Ni) or a Cu containing material. The plurality of upper insulation films 102*a*, 102*b*, 102*c* and 102*d* may include, for example, a prepreg having epoxy resin or acrylate impregnated into a mesh-type reinforced fiber. However, a portion surrounding the first bonding finger 102*p* may be, for example, epoxy resin based photo solder resist. As illustrated in FIG. 1B, in the substrate 10 according to exemplary embodiments of the present general inventive concept, the first wiring substrate 100 will be described with regard to a multi-layered wiring printed circuit board. In detail, the first upper stacked structure 102 and the first lower stacked structure 104 may have, for example, the same number of conductive patterns, but not limited thereto. In addition, the conductive patterns included in the first and second upper stacked structures 102 and 104 may have the same thickness.

The first support carrier 110 may have, for example, a rectangular plane. For example, the first support carrier 110 may have the same shape as the first wiring substrate 100, but exemplary embodiments of the present general inventive concept are not limited thereto. That is to say, since the first support carrier 110 may prevent warping of a semiconductor package during the course of fabricating the semiconductor package, the first support carrier 110 may take any shape. However, since the first support carrier 110 functions to prevent the warping of the semiconductor package, the first support carrier 110 should be rigid. In addition, since it is necessary to minimize shrinkage or expansion of the first support carrier 110 according to a thermal change within the semiconductor package, the first support carrier 110 may be, for example, a thermal insulator.

The adhesive film 120 may physically connect the second surface 100*b* of the first wiring substrate 100 to the first support carrier 110, for example. That is, the adhesive film 120 may allow the second surface 100*b*, instead of the surface on which the semiconductor chip is mounted, to be adhered to the first support carrier 110. The adhesive film 120 may be, for example, glue, but is not limited thereto.

The adhesive film 120 may further include a separator film 125. The separator film 125 may be, for example, a material that reacts when coming into contact with a particular chemical or light having a particular wavelength. Specifically, when the adhesive film 120 including the separator film 125 is exposed to a particular chemical, the separator film 125 may be dissolved in the particular chemical. Dissolution of the separator film 125 may divide the adhesive film 120 into two parts. Alternatively, when the adhesive film 120 including the separator film 125 is exposed to light having a particular wavelength, adhesion between the separator film 125 and the adhesive film 120 may be weakened. As the result, the adhesive film 120 may be divided into two parts.

For example, the separator film 125 may be positioned at a widthwise center of the adhesive film 120, but not limited thereto. That is to say, the separator film 125 may be disposed at a desired location where the adhesive film 120 is to be divided and then processed to divide the adhesive film 120 into two parts. Unlike in FIG. 1, when the first wiring substrate 100 does not have an external terminal, the separator film 125 may be disposed at a boundary between the first wiring substrate 100 and the adhesive film 120. Therefore, the separator film 125 may define the adhesive film 120 into two parts and may separate the adhesive film 120 into two parts in the fabrication process of a semiconductor package.

Hereinafter, thicknesses and coefficients of thermal expansion (CTEs) of the first wiring substrate 100, the first support carrier 110 and the adhesive film 120 associated with warping of a semiconductor package substrate will be described.

The thicknesses of the first wiring substrate 100, the first support carrier 110 and the adhesive film 120 will first be described.

During the semiconductor package fabrication process, a thermal process is used to electrically connect a semiconductor chip to a substrate of a semiconductor package substrate. As the semiconductor package becomes thinner, it may be affected more and more by the thermal process, which may cause an increase in the warping of the semiconductor package substrate. In order to lessen or prevent the warping of the semiconductor package substrate, it is necessary to increase a thickness d of the semiconductor package substrate. However, increasing the thickness d of the semiconductor package substrate may result in an increase in the overall thickness of the semiconductor package. However, if the thickness of the semiconductor package substrate can be reduced, the overall thickness of the semiconductor package may not increase.

In order to prevent the warping of the semiconductor package substrate during the semiconductor package fabrication process, the first support carrier 110 serves to increase the thickness d of the substrate 10. Therefore, a thickness d3 of the first support carrier 110 may vary according to the type of the first wiring substrate 100. In addition, the thickness d3 of the first support carrier 110 may vary according to the thickness d1 of the first wiring substrate 100.

In a case where the first wiring substrate 100 is severely deformed because a material forming the first wiring substrate 100 is vulnerable to heat, the thickness d of the first support carrier 110 can be increased to suppress the warping of the first wiring substrate 100. The deformation of the first wiring substrate 100 can be efficiently resolved by increasing the thickness d3 of the first support carrier 110, thereby decreasing or preventing the warping of the first wiring substrate 100. On the contrary, since the material forming the first wiring substrate 100 is tolerant to the thermal process, causing minor deformation to the first wiring substrate 100, the thickness d3 of the first support carrier 110 can be reduced to suppress the warping of the first wiring substrate 100.

When the thickness d1 of the first wiring substrate 100 is reduced with slimness of a semiconductor package, deformation of the first wiring substrate 100 due to the thermal process may increase. As such, if the thickness d1 of the first wiring substrate 100 is reduced, the thickness d3 of the first support carrier 110 can be increased. The increased thickness d3 of the first support carrier 110 can efficiently resolve the deformation of the first wiring substrate 100, thereby decreasing or preventing the warping of the first wiring substrate 100. On the contrary, when the thickness d1 of the first wiring substrate 100 is increased, the thickness d3 of the first support carrier 110 may be reduced.

Alternatively, in order to prevent the warping of the first wiring substrate 100 during the semiconductor package fabrication process, the adhesive film 120 may also increase the thickness d of the substrate 10 according to the present general inventive concept. Supposing the material forming the first wiring substrate 100 is vulnerable to the thermal process and severe deformation is caused to the first wiring substrate 100 or the thickness d1 of the first wiring substrate 100 is reduced, the thickness d2 of the adhesive film 120 may be increased while maintaining the thickness d3 of the first support carrier 110 at a fixed level. The adhesive film 120 can efficiently resolve deformation of the first wiring substrate 100 by increasing its thickness d2, thereby relieving or preventing the warping of the first wiring substrate 100.

Next, the coefficients of thermal expansion (CTEs) of the first wiring substrate 100, the first support carrier 110 and the adhesive film 120 will be described. As described above, the first wiring substrate 100 includes various materials. In other words, the first wiring substrate 100 includes materials having different CTEs. In the first wiring substrate 100 including materials having different CTEs, the CTE may be represented by, for example, a global coefficient of thermal expansion (GCTE). Here, the term "CTE" is used to encompass GCTE.

The thermal process used during the semiconductor package fabrication process may cause deformation, for example, warping, of the first wiring substrate 100, the first support carrier 110 and the adhesive film 120. When the first wiring substrate 100, the first support carrier 110 and the adhesive film 120 have different CTEs, respective amounts of deformation of the first wiring substrate 100, the first support carrier 110 and the adhesive film 120 may be different from one another. As such, the substrate 10 may undergo unexpected deformation, resulting in increased warping of the first wiring substrate 100. Therefore, the CTE of the first wiring substrate 100, the CTE of the first support carrier 110 and the CTE of the adhesive film 120 may be substantially the same or different by a predetermined amount. However, even if the CTE of the first wiring substrate 100, the CTE of the first support carrier 110 and the CTE of the adhesive film 120 are different from one another, the warping of the first wiring substrate 100 included in the substrate 10 can be relieved or prevented by adjusting the respective CTEs.

A modified example of the substrate of a semiconductor package illustrated in FIG. 1A will be described with reference to FIG. 2. This modified example is substantially the same as the previous exemplary embodiment, except for a first external terminal 108. Thus, the same functional components as those of the previous embodiment are denoted by the same reference numerals and descriptions thereof will be briefly made or omitted.

Referring to FIG. 2, a substrate 12 of a semiconductor package includes a first wiring substrate 100, a first support carrier 110 and an adhesive film 120. The first wiring substrate 100 further includes the first external terminal 108 disposed on a second surface 100b.

For example, the first external terminal 108 disposed on the second surface 100b may electrically connect the semiconductor package to an external device. The first external terminal 108 may be disposed on a first terminal pad 104p. The first external terminal 108 may be, for example, a solder ball, and may be wetted to the first terminal pad 104p by a thermal process.

Before the first wiring substrate 100 and the first support carrier 110 are connected by the adhesive film 120, the first external terminal 108 is disposed on the first terminal pad 104p. Therefore, the adhesive film 120 may surround the first external terminal 108. In other words, in the substrate 12, the first external terminal 108 may be disposed within the adhesive film 120.

A substrate of a semiconductor package according to another exemplary embodiment of the present general inventive concept will be described with reference to FIGS. 3 and 4.

Figure 3:
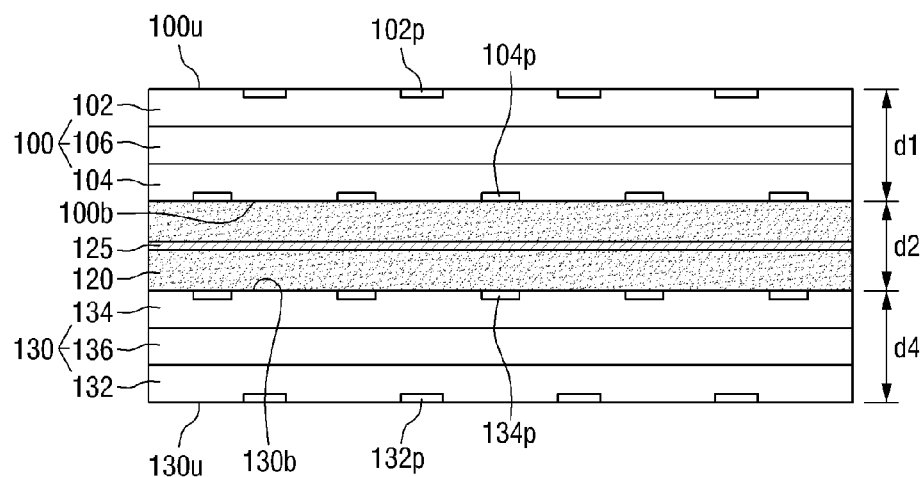
FIG. 3 is a side view illustrating a substrate of a semiconductor package according to another exemplary embodiment of the present general inventive concept.
Figure 4:
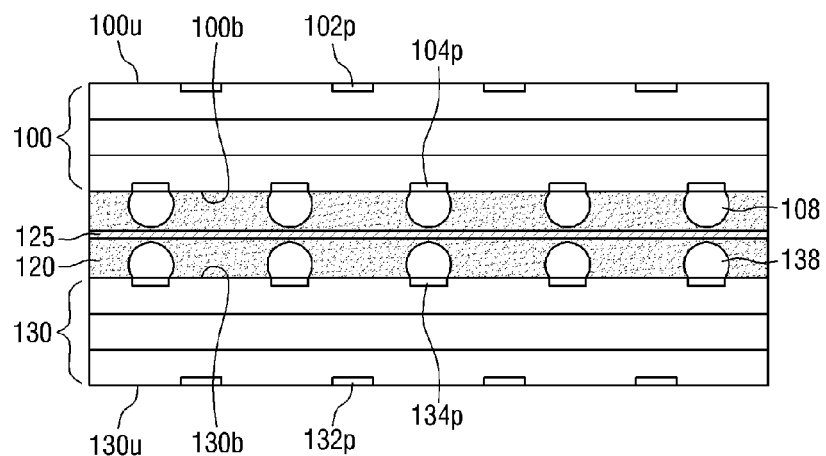
FIG. 4 is a side view illustrating a modified example of the substrate of a semiconductor package illustrated in FIG. 3.

FIG. 3 is a side view illustrating a substrate for a semiconductor package according to another exemplary embodiment of the present general inventive concept and FIG. 4 is a side view illustrating a modified example of the substrate for a semiconductor package illustrated in FIG. 3.

Referring to FIG. 3, the substrate 20 of a semiconductor package according to another exemplary embodiment of the present general inventive concept includes a first wiring substrate 100, a second wiring substrate 130 and an adhesive film 120. The substrate 20 illustrated in FIG. 3 is different from the substrate 10 illustrated in FIG. 1A in that the first support carrier 110 is replaced by the second wiring substrate 130.

In detail, the first wiring substrate 100 includes a first surface 100u and a second surface facing each other. In the first wiring substrate 100, the first surface 100u may be, for example, a surface on which a semiconductor chip is mounted. The second wiring substrate 130 includes a third surface 130u and a fourth surface 130b facing each other. In the second wiring substrate 130, the third surface 130u may be, for example, a surface on which a semiconductor chip is mounted. The fourth surface 130b may be, for example, a surface on which an external terminal electrically connected to an external power supply is disposed. For example, the adhesive film 120 may connect the second surface 100b of the first wiring substrate 100 and the fourth surface 130b of the second wiring substrate 130, facing each other. That is to say, the adhesive film 120 may physically connect the second surface 100b and the fourth surface 130b.

The second wiring substrate 130 may have a same plane shape as the first wiring substrate 100, for example, a rectangular plane. In detail, a width of the second wiring substrate 130 may be same as that of the first wiring substrate 100, but not limited thereto.

A first bonding finger 102p may be disposed on the first surface 100u of the first wiring substrate 100 and a first terminal pad 104p may be disposed on the second surface 100b. A second bonding finger 132p may be disposed on the third surface 130u of the second wiring substrate 130 and a second terminal pad 134p may be disposed on the fourth surface 130b. The first bonding finger 102p and the second bonding finger 132p are not exposed to the outside by the adhesive film 120. In addition, the first bonding finger 102p and the second bonding finger 132p are opposed to and face each other with the adhesive film 120 disposed therebetween, but not limited thereto.

The first wiring substrate 100 includes a first upper stacked structure 102, a first core insulation film 106 and a first lower stacked structure 104. The second wiring substrate 130 includes a second upper stacked structure 132, a second core insulation film 136 and a second lower stacked structure 134. The first wiring substrate 100 and the second wiring substrate 130 may be, for example, multi-layered wiring PCBs, but not limited thereto.

That is to say, only one of the first wiring substrate 100 and the second wiring substrate 130 may be a multi-layered wiring PCB, or both of the first wiring substrate 100 and the second wiring substrate 130 may be multi-layered wiring PCBs.

Referring to FIG. 3, a thickness d1 of the first wiring substrate 100 and a thickness d4 of the second wiring substrate 130 may be substantially the same. That is to say, the substrate 20 may be a substrate having two wiring substrates adhered by the adhesive film 120 for fabricating the same semiconductor package. Here, the phrase "the same thickness" is used to mean that two or more thicknesses compared are completely equal to each other and to encompass a thickness difference, which may be created due to a processing margin. In addition, the phrase "the same semiconductor package" is used to mean that two or more shapes and functions compared are completely equal to each other and to encompass a difference in shape, which may be created due to a processing margin.

The thickness d1 of the first wiring substrate 100 and the thickness d4 of the second wiring substrate 130 may be different from each other.

In a case where the warping of the first wiring substrate 100 becomes severe due to a reduction in the thickness d1 of the first wiring substrate 100, the warping of the first wiring substrate 100 can be lessened or prevented by increasing the thickness d4 of the second wiring substrate 130. In contrast, when the warping of the first wiring substrate 100 is suppressed due to an increase in the thickness d1 of the first wiring substrate 100, the warping of the first wiring substrate 100 may become less sensitive to a change in the thickness d4 of the second wiring substrate 130.

The warping of the first wiring substrate 100 can also be lessened or prevented during a semiconductor package fabrication process using the thickness d2 of the adhesive film 120, instead of the thickness d1 of the first wiring substrate 100 or the thickness d4 of the second wiring substrate 130.

The first wiring substrate 100, the second wiring substrate 130 and the adhesive film 120 may have substantially the same CTE. However, the warping of the first wiring substrate 100 of the substrate 20 can also be lessened or prevented by adjusting the CTE of the first wiring substrate 100, the CTE of the second wiring substrate 130 and the CTE of the adhesive film 120.

In addition, even if the thickness d1 of the first wiring substrate 100 and the thickness d4 of the second wiring substrate 130 are the same, the CTE of the first wiring substrate 100 and the CTE of the second wiring substrate 130 may be different from each other. In a case where a thickness of a conductive pattern included in the first wiring substrate 100 is different from a thickness of a conductive pattern included in the first wiring substrate 100, the CTE of the first wiring substrate 100 and the CTE of the second wiring substrate 130 may be different from each other. In this case, in order to make the CTE of the first wiring substrate 100 and the CTE of the second wiring substrate 130 substantially the same, the thickness d1 of the first wiring substrate 100 and the thickness d4 of the second wiring substrate 130 may be made to be different.

A modified example of the substrate of a semiconductor package illustrated in FIG. 3 will be described with reference to FIG. 4.

Referring to FIG. 4, a substrate 22 of a semiconductor package includes a first wiring substrate 100, a second wiring substrate 130 and an adhesive film 120. The first wiring substrate 100 further includes a first external terminal 108 disposed on a second surface 100b.

The second wiring substrate 130 may include a second external terminal 138 disposed on a fourth surface 130b. The substrate 22 according to the exemplary embodiment of the present general inventive concept includes the first external terminal 108 and the second external terminal 138, but not limited thereto. In other words, the first external terminal 108 or the second external terminal 138 may be disposed on at least one of the second surface 100b of the first wiring substrate 100 and the fourth surface 130b of the second wiring substrate 130.

The first external terminal 108 may be disposed on the first terminal pad 104p and the second external terminal 138 may be disposed on the second terminal pad 134p. The first external terminal 108 and the second external terminal 138 may be disposed to face each other with the adhesive film 120 disposed therebetween, but not limited thereto.

Before the first wiring substrate 100 and the second wiring substrate 130 are connected by the adhesive film 120, the first external terminal 108 and the second external terminal 138 are disposed on the second surface 100b and the fourth surface 130b, respectively. Therefore, the first external terminal 108 the second external terminal 138 may be disposed within the adhesive film 120 and may be surrounded by the adhesive film 120. Referring to FIG. 4, a thickness of the adhesive film 120 is greater than a sum of heights of the first external terminal 108 and the second external terminal 138, but is not limited thereto. That is to say, when the first external terminal 108 and the second external terminal 138 are disposed in a zigzag configuration (i.e., the first external terminal 108 and the second external terminal 138 being disposed to not be directly across from one another, but instead to alternate), a thickness d2 of the adhesive film 120 may be greater than or equal to a larger value of the heights of the first external terminal 108 and the second external terminal 138.

A substrate of a semiconductor package according to still another exemplary embodiment of the present general inventive concept will be described with reference to FIGS. 5 and 6.

Figure 5:
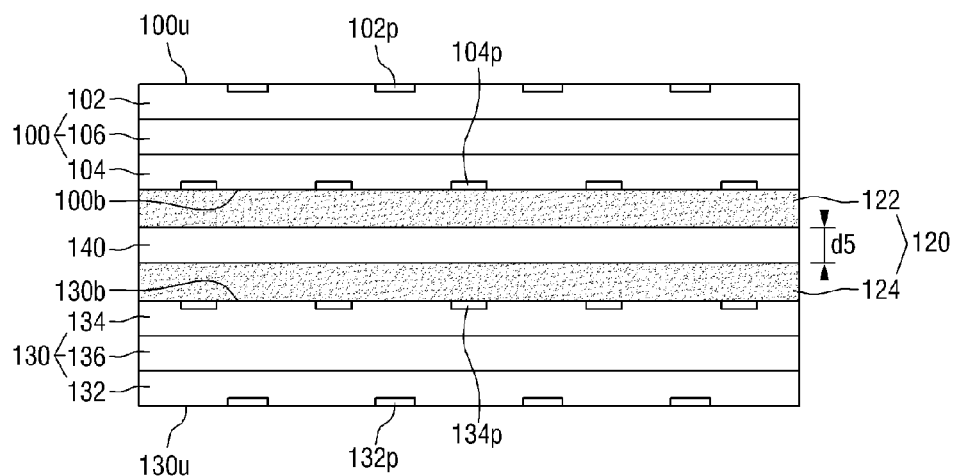
FIG. 5 is a side view illustrating a substrate of a semiconductor package according to still another exemplary embodiment of the present general inventive concept.
Figure 6:
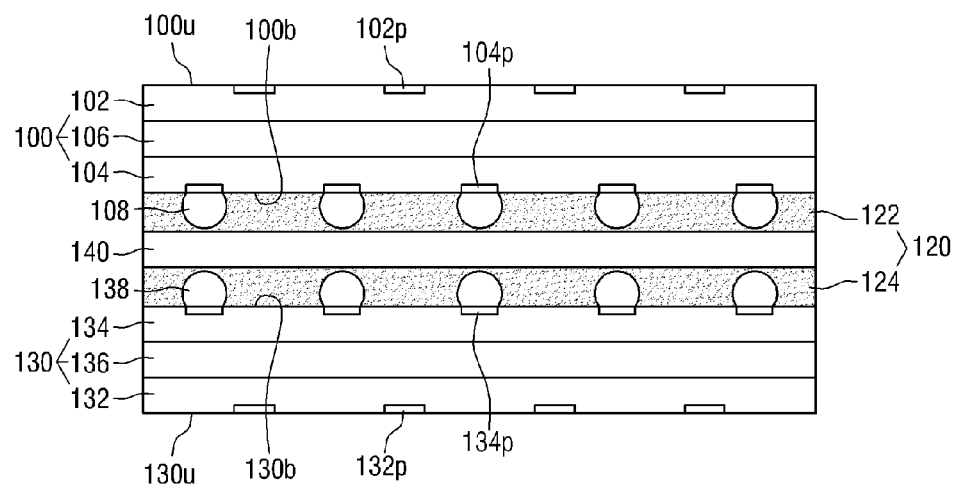
FIG. 6 is a side view illustrating a modified example of the substrate of a semiconductor package illustrated in FIG. 5.

FIG. 5 is a side view illustrating a substrate of a semiconductor package according to still another exemplary embodiment of the present general inventive concept and FIG. 6 is a side view illustrating a modified example of the substrate of a semiconductor package illustrated in FIG. 5.

Referring to FIG. 5, the substrate 30 of a semiconductor package according to still another exemplary embodiment of the present general inventive concept includes a first wiring substrate 100, a second wiring substrate 130, a second support carrier 140 and an adhesive film 120. The second support carrier 140 may be disposed between the first wiring substrate 100 and the second wiring substrate 130. The substrate 30 illustrated in FIG. 5 is different from the substrate 20 illustrated in FIG. 3 in that it further includes a second support carrier 140.

The adhesive film 120 may include an upper adhesive film 122 and a lower adhesive film 124. The upper adhesive film 122 connects one surface of the second support carrier 140 and a second surface 100b of the first wiring substrate 100. The lower adhesive film 124 connects the other surface of the second support carrier 140 and a fourth surface 130b of the second wiring substrate 130. The substrate 30 according to the exemplary embodiment of the present general inventive concept may have a structure in which the second wiring substrate 130, the lower adhesive film 124, the second support carrier 140, the upper adhesive film 122 and the first wiring substrate 100 may be sequentially stacked. Although not illustrated in FIG. 5, each of the upper adhesive film 122 and the lower adhesive film 124 may further include a separator film.

For example, the second support carrier 140 may be disposed between the second surface 100b of the first wiring substrate 100 and the fourth surface 130b of the second wiring substrate 130, facing each other. The second support carrier 140 may have the same planar shape with the first wiring substrate 100 and/or the second wiring substrate 130. In FIG. 5, the second support carrier 140 divides the adhesive film 120 into two parts. However, the second support carrier 140 may be surrounded by the adhesive film 120. Since the second support carrier 140 prevents warping of the semiconductor package during the semiconductor package fabrication process, it should be rigid. In addition, in order to minimize deformation, such as shrinkage or expansion of the second support carrier 140 according to a thermal change, the second support carrier 140 may be, for example, a thermal insulator.

A thickness d5 of the second support carrier 140 may vary according to thicknesses of the first wiring substrate 100 and the second wiring substrate 130. For example, if the warping of the first wiring substrate 100 and the second wiring substrate 130 becomes severe even if the thicknesses of the first wiring substrate 100 and the second wiring substrate 130 are very small and the thickness of the adhesive film is increased, the second support carrier 140, which is disposed between the first wiring substrate 100 and the second wiring substrate 130, may act as a thermal insulator to lessen or prevent the warping of the first wiring substrate 100 and the second wiring substrate 130.

The thickness d5 of the second support carrier 140 may vary according to the thicknesses of the first wiring substrate 100 and the second wiring substrate 130. In addition, in consideration of the respective thicknesses of the first wiring substrate 100 and the second wiring substrate 130, a location of the second support carrier 140 disposed between the first wiring substrate 100 and the second wiring substrate 130 may be adjusted.

A modified example of the substrate of a semiconductor package illustrated in FIG. 5 will be described with reference to FIG. 6.

Referring to FIG. 6, a substrate 32 of a semiconductor package includes a first wiring substrate 100, a second wiring substrate 130, an adhesive film 120 and a second support carrier 140. The adhesive film 120 includes an upper adhesive film 122 and a lower adhesive film 124. The first wiring substrate 100 and the second wiring substrate 130 may further include a first external terminal 108 and a second external terminal 138, respectively. Unlike in FIG. 5, the first external terminal 108 or the second external terminal 138 may be disposed on at least one of the second surface 100b of the first wiring substrate 100 and the fourth surface 130b of the second wiring substrate 130.

The first external terminal 108 disposed on the first terminal pad 104p may be disposed within the upper adhesive film 122 and may be surrounded by the upper adhesive film 122. The second external terminal 138 disposed on the second terminal pad 134p may be disposed within the lower adhesive film 124 and may be surrounded by the lower adhesive film 124.

A method of fabricating a substrate of a semiconductor package according to an exemplary embodiment of the present general inventive concept will be described with reference to FIGS. 7 through 13. In the following description, the method of fabricating a substrate of a semiconductor package according to an exemplary embodiment of the present general inventive concept will be described with regard to the substrate 22 illustrated in FIG. 4.

FIGS. 7 through 13 are side views illustrating intermediate process steps to explain a method of fabricating the substrate 22 of a semiconductor package according to an exemplary embodiment of the present general inventive concept.

Figure 7:
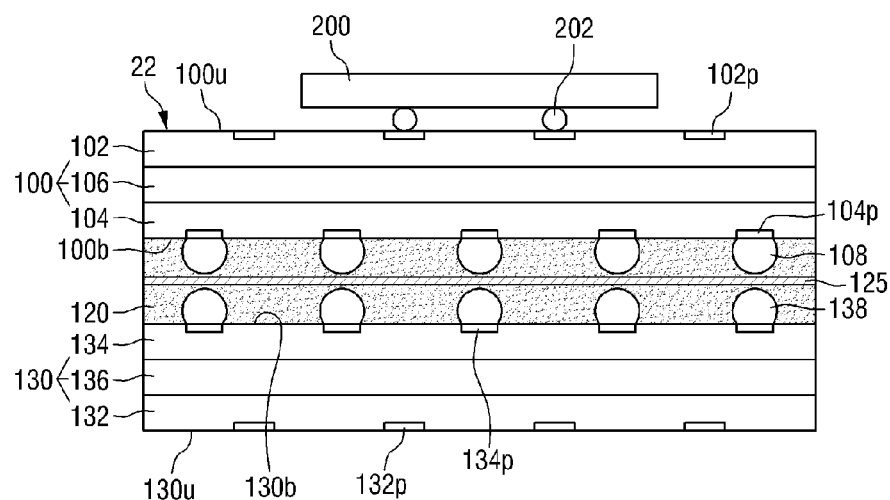
FIGS. 7 through 13 are side views illustrating intermediate process steps to explain a method of fabricating a substrate of a semiconductor package according to an exemplary embodiment of the present general inventive concept.

Referring to FIG. 7, a first lower semiconductor chip 200 may be mounted on the substrate 22. The substrate 22 may include a first wiring substrate 100, a second wiring substrate 130 and an adhesive film 120. The first wiring substrate 100 and the second wiring substrate 130 may further include a first external terminal 108 and a second external terminal 138, respectively. The first wiring substrate 100 includes a first surface 100u and a second surface 100b facing each other, and the second wiring substrate 130 includes a third surface 130u and a fourth surface 130b facing each other. The first external terminal 108 and the second external terminal 138 are disposed on the second surface 100b and the fourth surface 130b, respectively, and may be surrounded by the adhesive film 120. The adhesive film 120 may further include a separator film 125 dividing the adhesive film 120 into two parts.

In detail, the first lower semiconductor chip 200 may be mounted on the first surface 100u of the first wiring substrate 100. The first lower semiconductor chip 200 may be electrically connected to the first wiring substrate 100 by a first lower solder ball 202. In detail, the first lower semiconductor chip 200 including the first lower solder ball 202 may be disposed on the first surface 100u. More specifically, the first lower solder ball 202 may be disposed on a first bonding finger 102p on the first surface 100u. The substrate 22 having the first lower semiconductor chip 200 disposed thereon may be subjected to a thermal process. During the thermal process, the first lower solder ball 202 may be reflowed to be wetted to the first bonding finger 102p. When the first lower solder ball 202 is wetted to the first bonding finger 102p, the first wiring substrate 100 and the first lower semiconductor chip 200 may be electrically connected.

The first lower semiconductor chip 200 may be, for example, a memory chip or a logic chip. When the first lower semiconductor chip 200 is a logic chip, it may be designed in various manners in considerations of operations executed. When the first lower semiconductor chip 200 is a memory chip, the memory chip may be, for example, a nonvolatile memory chip). In detail, the memory chip 200 may be a flash memory chip. In more detail, the memory chip 200 may be one of a NAND flash memory chip or a NOR flash memory chip, but not limited thereto. In some exemplary embodiments of the present general inventive concept, the memory chip 200 may be one of a phase change random access memory (PRAM), a magneto-resistive random access memory (MRAM), and a resistive random access memory (RRAM), but is not limited thereto. The first lower semiconductor chip 200 may be, for example, a flip chip, and the first lower solder ball 202 may be formed on a surface on which a semiconductor device circuit is formed. Alternatively, the first lower solder ball 202 may be connected to the first wiring substrate 100 through hole via (TSV) passing through the first lower semiconductor chip 200. Unlike in FIG. 7, the first lower semiconductor chip 200 may be connected to the first external terminal 108 by a wire. In the following description, the first lower semiconductor chip 200 is electrically connected to the first wiring substrate 100 by a solder ball.

Figure 8:
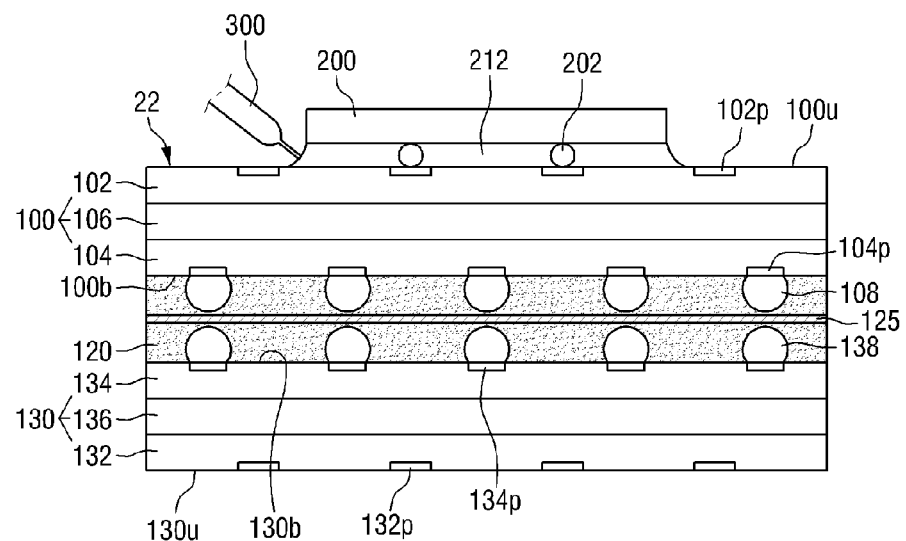

Referring to FIG. 8, a first lower molding member 212 filling a portion between the first lower semiconductor chip 200 and the first surface 100u may be formed. In detail, a dispenser 300 is disposed at one side of the first lower semiconductor chip 200, and an underfill material may be injected into the portion between the first lower semiconductor chip 200 and the first surface 100u from the dispenser 300. The injected underfill material may fill the portion between the first lower semiconductor chip 200 and the first wiring substrate 100 to form the first lower molding member 212. The first lower molding member 212 may completely surround the first lower solder ball 202, but not limited thereto. The first lower molding member 212 may include, for example, epoxy resin.

According to FIG. 8, the first lower molding member 212 filling the portion between the first lower semiconductor chip 200 and the first surface 100u is formed only between the first lower semiconductor chip 200 and the first surface 100u. However, the forming of the first lower molding member 212 illustrated in FIG. 8 is provided only for illustration of an exemplary embodiment of the present general inventive concept, so it is not limited thereto. As such, the first lower molding member 212 may also be formed to surround a portion of a lateral surface of the first lower semiconductor chip 200. Alternatively, the first lower molding member 212 may completely surround the lateral surface of the first lower semiconductor chip 200, and a portion of the first lower molding member 212 may cover a portion of a surface facing the surface on which the first lower solder ball 202 is disposed.

Due to warping of the first wiring substrate 100 occurring during a semiconductor package fabricating process, non-wetting of the first lower solder ball 202 and the first bonding finger 102p may not be caused after forming the first lower molding member 212, for example.

Figure 9A:
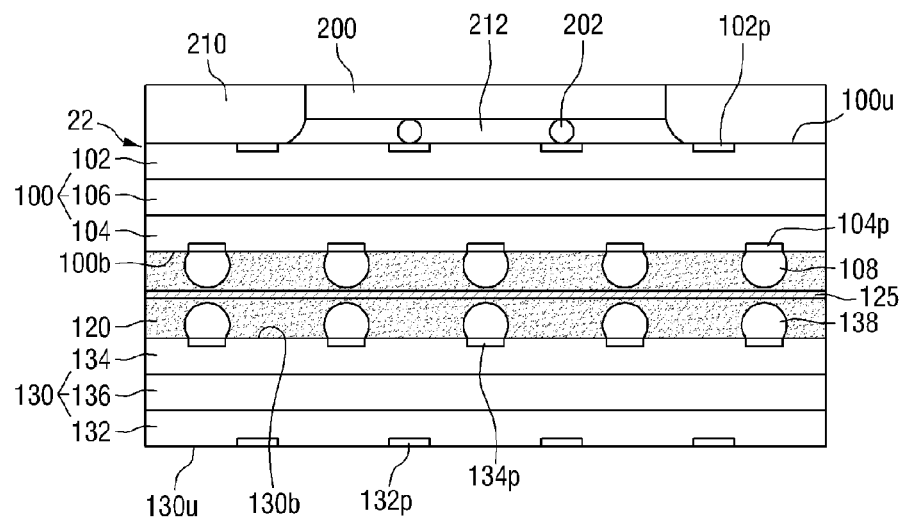
Figure 9B:
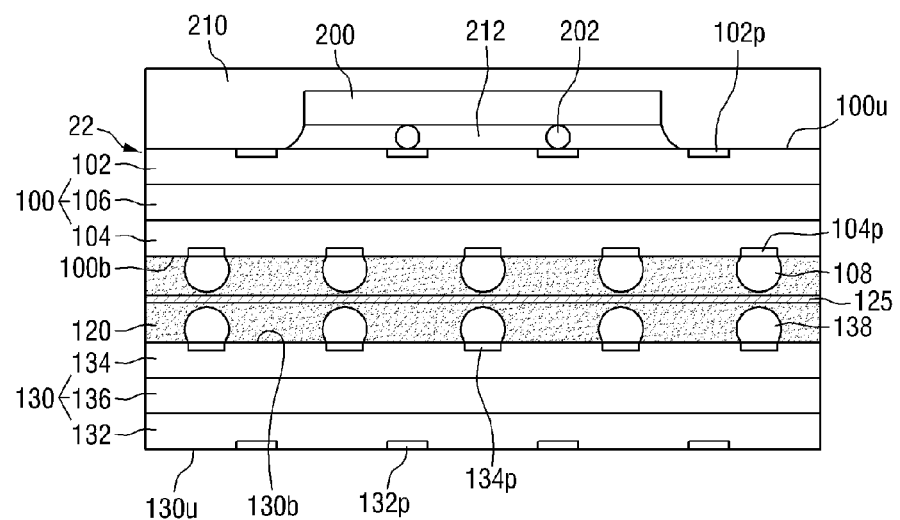

Referring to FIGS. 9A and 9B, a first upper molding member 210 surrounding the first lower semiconductor chip 200 may be formed. The first upper molding member 210 may be, for example, an epoxy molding compound (EMC). The first upper molding member 210 may be formed by, for example, a molded underfill (MUF) method.

Referring to FIG. 9A, the first upper molding member 210 may completely surround the lateral surface of the first lower semiconductor chip 200 and the first lower molding member 212. In addition, the first upper molding member 210 may cover the first surface 100u of the first wiring substrate 100. However, a top surface of the first lower semiconductor chip 200 may be exposed by the first upper molding member 210. After the substrate 22 is separated by exposing the top surface of the first lower semiconductor chip 200, the thickness of the semiconductor package may be reduced.

Referring to FIG. 9B, the first upper molding member 210 may surround the first lower semiconductor chip 200, the first lower molding member 212 and the first surface 100u. Unlike in FIG. 9A, the first upper molding member 210 may completely cover the top surface of the first lower semiconductor chip 200.

Figure 10:
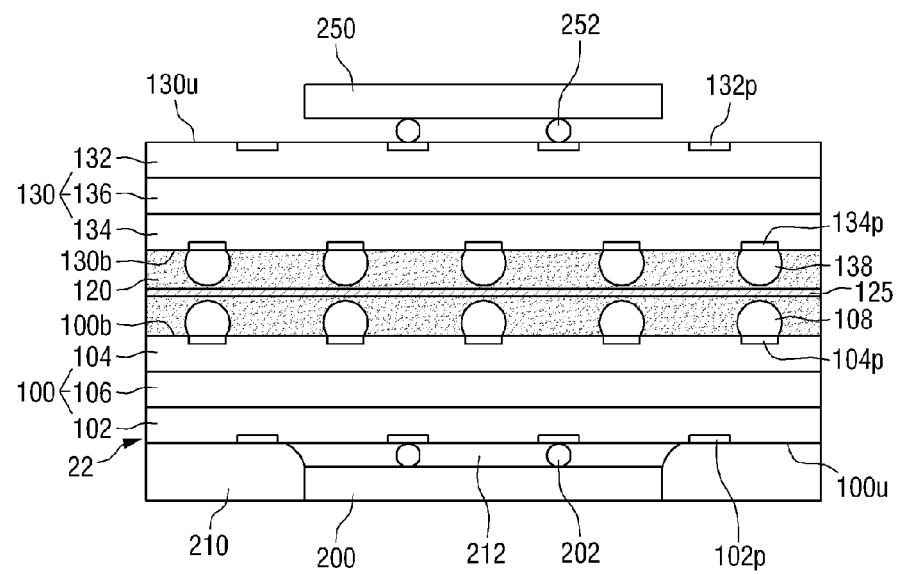

Referring to FIG. 10, a second lower semiconductor chip 250 may be mounted on the third surface 130u of the second wiring substrate 130. The second lower semiconductor chip 250 may be electrically connected to the second wiring substrate 130 by the second lower solder ball 252. In detail, the second lower semiconductor chip 250 including a second lower solder ball 252 may be disposed on the third surface 130u. As such, the second lower solder ball 252 may be disposed on a second bonding finger 132p on the third surface 130u. For example, the second lower solder ball 252 may be wetted to the second bonding finger 132p by, for example, a reflow process. The second wiring substrate 130 and the second lower semiconductor chip 250 may be electrically connected by the wetting of the second lower solder ball 252 and the second bonding finger 132p. The second lower semiconductor chip 250 may be, for example, a memory chip or a logic chip. The second lower semiconductor chip 250 may be mounted on the third surface 130u in, for example, a flip chip type. Alternatively, the second lower solder ball 252 may electrically connect a through hole via (TSV) passing through the second lower semiconductor chip 250 to the second wiring substrate 130.

Figure 11:
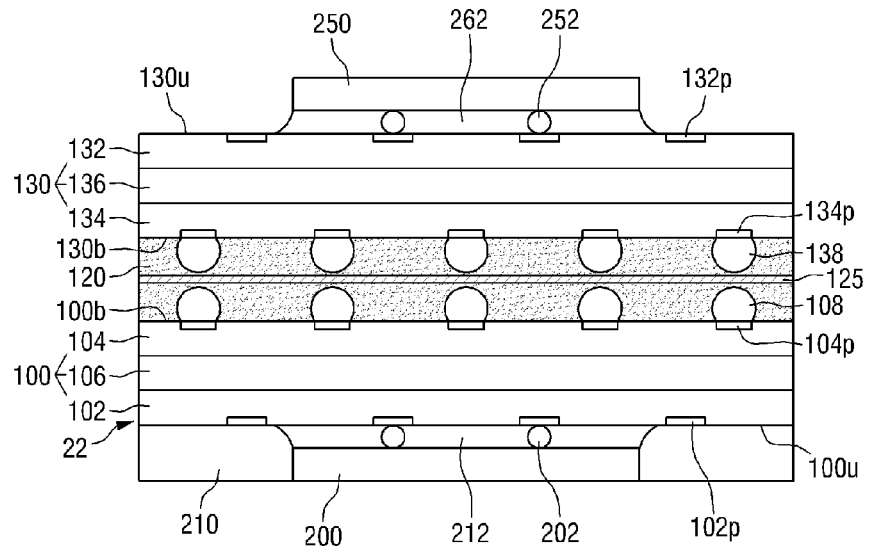

Referring to FIG. 11, a second lower molding member 262 filling a portion between the second lower semiconductor chip 250 and the third surface 130u may be formed. The second lower molding member 262 may be formed in the same manner as the first lower molding member illustrated in FIG. 8. That is to say, the second lower molding member 262 may be formed only between the second lower semiconductor chip 250 and the third surface 130u. Alternatively, the second lower molding member 262 may surround a portion of a lateral surface of the second lower semiconductor chip 250. Alternatively, the second lower molding member 262 may completely surround the lateral surface of the second lower semiconductor chip 250, and a portion of the second lower molding member 262 may cover a portion of a surface facing the surface on which the second lower solder ball 252 is disposed.

Figure 12:
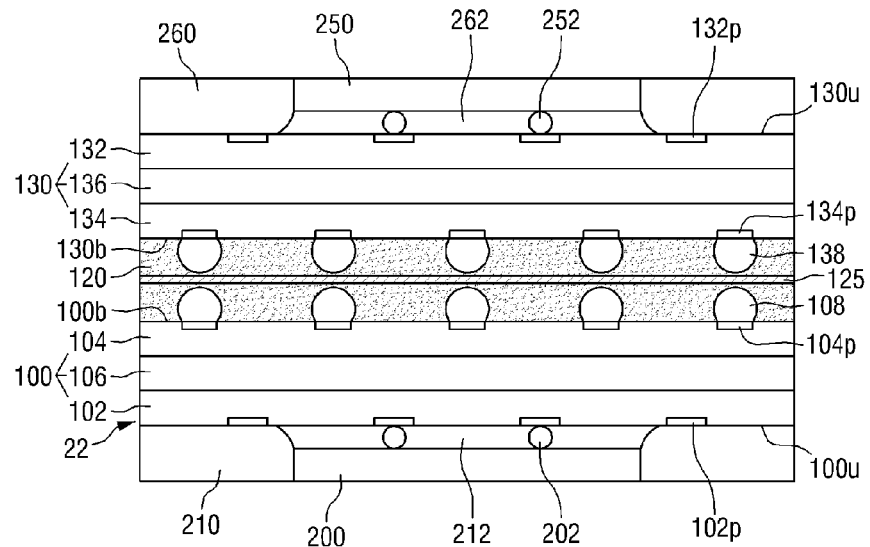

Referring to FIG. 12, a second upper molding member 260 surrounding the second lower semiconductor chip 250 may be formed. The second upper molding member 260 may completely surround the lateral surface of the second lower semiconductor chip 250 and the second lower molding member 262. In addition, the second upper molding member 260 may cover the third surface 130u of the second wiring substrate 130. However, a top surface of the second lower semiconductor chip 250 may be exposed by the second upper molding member 260.

The top surface of the first lower semiconductor chip 200 and the top surface of the second lower semiconductor chip 250 may be exposed by the first upper molding member 210 and the second upper molding member 260, respectively, but not limited thereto. Only one of the top surface of the first lower semiconductor chip 200 and the top surface of the second lower semiconductor chip 250 may be exposed. Alternatively, both of the top surface of the first lower semiconductor chip 200 and the top surface of the second lower semiconductor chip 250 may be covered by the first upper molding member 210 and the second upper molding member 260, respectively.

Figure 13:
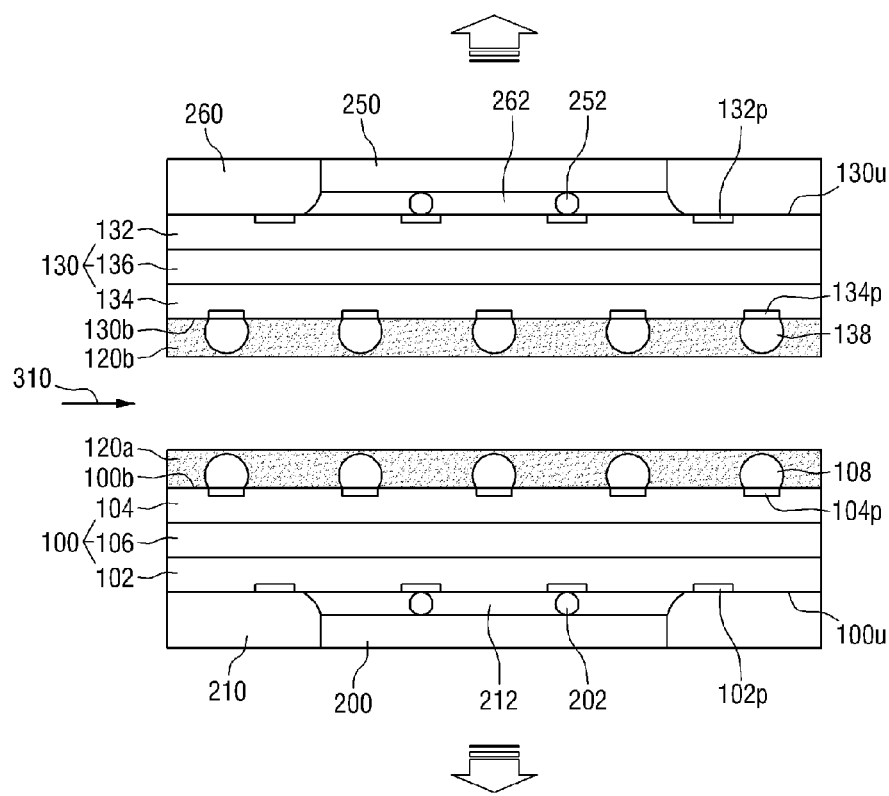

Referring to FIG. 13, the first wiring substrate 100 having the first lower semiconductor chip 200 mounted thereon and the second wiring substrate 130 having the second lower semiconductor chip 250 mounted thereon are separated from each other. The first wiring substrate 100 and the second wiring substrate 130 may be separated from each other by dividing the adhesive film 120 into a first region 120a and a second region 120b. In detail, the adhesive film 120 including a separator film 125 is divided into the first region 120a and the second region 120b, thereby separating the first wiring substrate 100 and the second wiring substrate 130 from each other.

A method, as indicated by an arrow 310, of separating the first wiring substrate 100 and a second wiring substrate 130 may include a chemically separating method and a physically separating method. First, in the chemically separating method, a chemical material reacting with the separator film 125 may be used. In such a way, the adhesive film 120 is divided into the first region 120a and the second region 120b, thereby separating the first wiring substrate 100 and the second wiring substrate 130 from each other. Next, in the physically separating method, an ultraviolet (UV) light or laser, for example, may be irradiated into the separator film 125. If the UV light or laser is irradiated into the separator film 125, adhesion between the separator film 125 and the adhesive film 120 may be weakened at a boundary therebetween. The weakened boundary between the first wiring substrate 100 and the adhesive film 120 may be cut to divide the adhesive film 120 into the first region 120a and the second region 120b.

Therefore, the adhesive film 120 may remain in the second surface 100b of the first wiring substrate 100 and the fourth surface 130b of the second wiring substrate 130, which are separated from each other. Thereafter, the remaining adhesive film 120 is washed, thereby fabricating the semiconductor package.

A modified example of the method of fabricating a substrate of a semiconductor package illustrated in FIGS. 7 through 13 will be described with reference to FIGS. 14 and 15. This modified example is substantially the same as the previous exemplary embodiment, except that a plurality of semiconductor chips are mounted on a wiring substrate. Thus, the same functional components as those of the previous embodiment are denoted by the same reference numerals and descriptions thereof will be briefly made or omitted.

Figure 14:
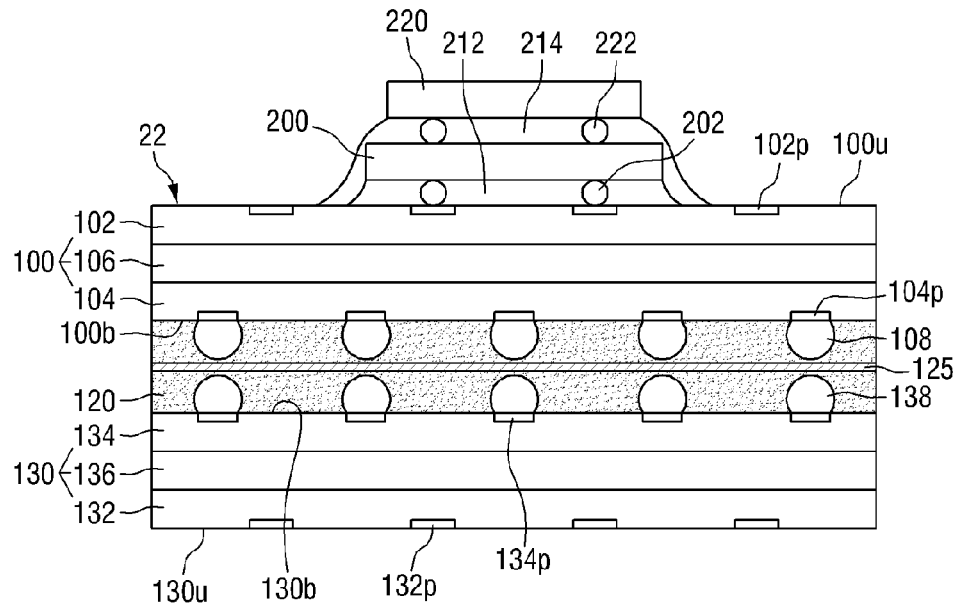
FIGS. 14 and 15 are side views illustrating intermediate process steps to explain a modified example of the method of fabricating a substrate of a semiconductor package illustrated in FIGS. 7 through 13.
Figure 15:
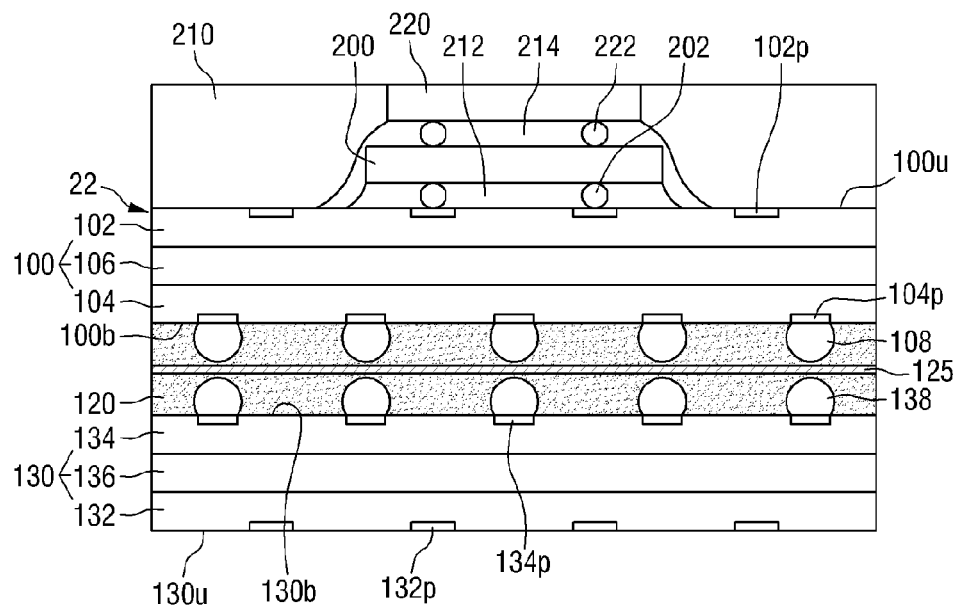

FIGS. 14 and 15 are side views illustrating intermediate process steps to explain a modified example of the method of fabricating a substrate of a semiconductor package illustrated in FIGS. 7 through 13.

Referring to FIGS. 14 and 15, a first lower semiconductor chip 200 may be mounted on a first surface 100u of a first wiring substrate 100. The first lower semiconductor chip 200 may be connected to a first bonding finger 102p by the first lower solder ball 202. Thereafter, a first lower molding member 212 filling a portion between the first lower semiconductor chip 200 and the first surface 100u may be formed. The first lower molding member 212 may surround the first lower solder ball 202. A first upper semiconductor chip 220 may be mounted on the first lower semiconductor chip 200 having the first lower molding member 212 formed thereon. The first upper semiconductor chip 220 may be electrically connected to the first lower semiconductor chip 200 by a first upper solder ball 222. The first upper semiconductor chip 220 may be, for example, a memory chip or a logic chip. The first upper semiconductor chip 220 may be mounted on the first lower semiconductor chip 200 in, for example, a flip chip type. Alternatively, the first upper solder ball 222 may electrically connect a through hole via (TSV) passing through the first upper semiconductor chip 220 to the first lower semiconductor chip 200. A third lower molding member 214 filling a portion between the first upper semiconductor chip 220 and the first lower semiconductor chip 200 may be formed. The third lower molding member 214 may surround the first upper solder ball 222. Alternatively, the third lower molding member 214 may completely surround the top and lateral surfaces of the first lower semiconductor chip 200 and the first lower molding member 212.

Thereafter, a first upper molding member 210 surrounding the first upper semiconductor chip 220 and the first lower semiconductor chip 200 may be formed. The first upper molding member 210 may completely surround the first lower semiconductor chip 200. However, the first upper molding member 210 may surround only the lateral surface of the first upper semiconductor chip 220 but may expose the top surface of the first upper semiconductor chip 220, but not limited thereto.

A plurality of semiconductor chips may also be mounted on the second wiring substrate 130 in the same manner as described above.

A method of fabricating a substrate of a semiconductor package according to another exemplary embodiment of the present general inventive concept will be described with reference to FIGS. 7 through 11 and FIGS. 16 and 17.

Figure 16:
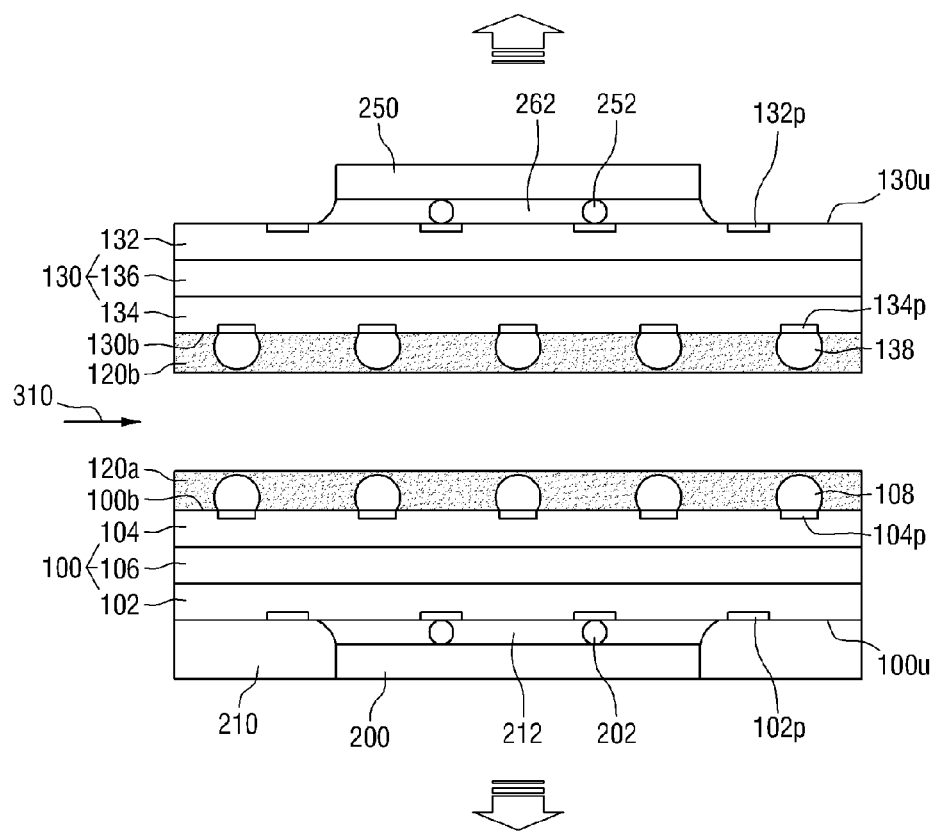
FIGS. 16 and 17 are side views illustrating intermediate process steps for explaining a method for fabricating a substrate for a semiconductor package according to another exemplary embodiment of the present general inventive concept.
Figure 17:
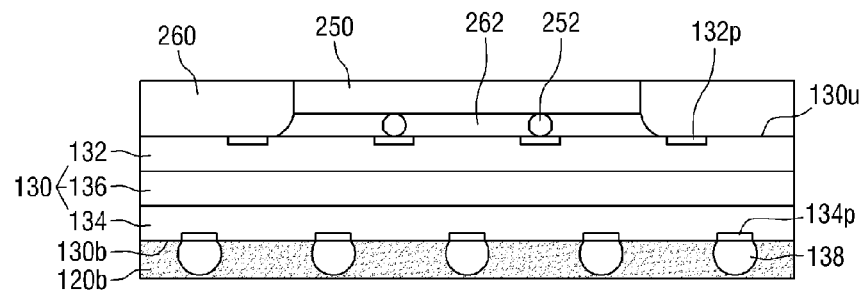
Figure 17:
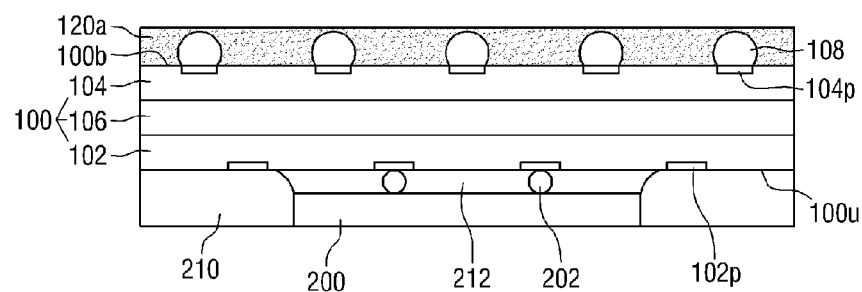

FIGS. 16 and 17 are side views illustrating intermediate process steps to explain a method of fabricating a substrate of a semiconductor package according to another exemplary embodiment of the present general inventive concept.

Referring to FIG. 16, the first lower semiconductor chip 200 is mounted on the first surface 100u of the first wiring substrate 100. The first lower semiconductor chip 200 is surrounded by the first upper molding member 210 and the top surface of the first lower semiconductor chip 200 is exposed by the first upper molding member 210. A second lower semiconductor chip 250 is mounted on the third surface 130u of the second wiring substrate 130. A second lower molding member 262 is formed between the third surface 130u and the second lower semiconductor chip 250.

After forming the second lower molding member 262, the first wiring substrate 100 and the second wiring substrate 130 may be separated from each other. In detail, the separator film 125 of FIG. 11 may be exposed to, for example, a chemical material, UV light or laser, to separate the adhesive film 120 into a first region 120a and a second region 120b.

After forming the second lower molding member 262 filling the portion between the second wiring substrate 130 and the second lower semiconductor chip 250, the second lower solder ball 252 and the second bonding finger 132p are rarely separated from each other. Therefore, even if the substrate 22 is separated into two parts by the adhesive film 120 separated into two regions after forming the second lower molding member 262, a contact failure problem occurring between the second lower semiconductor chip 250 and the second wiring substrate 130 can be prevented or suppressed.

Referring to FIG. 17, a second upper molding member 260 surrounding the second lower semiconductor chip 250 mounted on the separated second wiring substrate 130 may be formed. The second upper molding member 260 may completely surround the lateral surface of the second lower semiconductor chip 250 and the second lower molding member 262. Alternatively, the second upper molding member 260 may cover the third surface 130u of the second wiring substrate 130. The top surface of the second lower semiconductor chip 250 may be exposed by the second upper molding member 260, but not limited thereto.

A method for fabricating a substrate of a semiconductor package according to still another exemplary embodiment of the present general inventive concept will be described with reference to FIGS. 18 and 19. In the following description, the method of fabricating a substrate of a semiconductor package according to still another exemplary embodiment of the present general inventive concept will be described with regard to the substrate 22 illustrated in FIG. 4.

Figure 18:
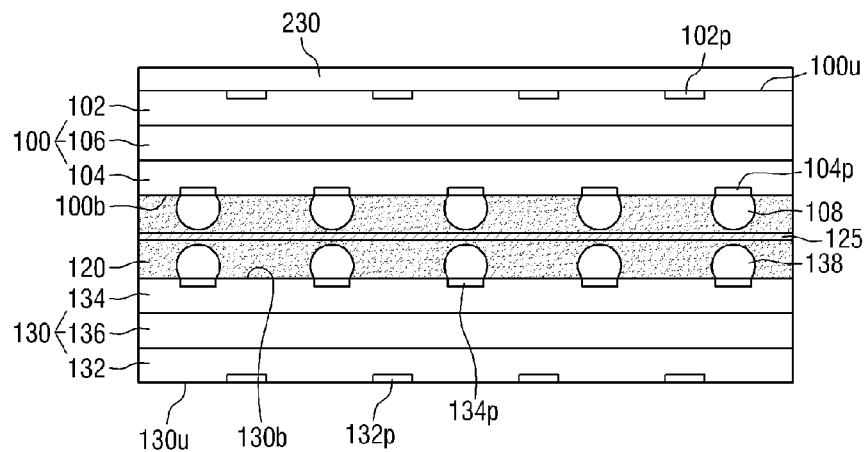
FIGS. 18 and 19 are side views illustrating intermediate process steps to explain a method of fabricating a substrate of a semiconductor package according to another exemplary embodiment of the present general inventive concept.
Figure 19:
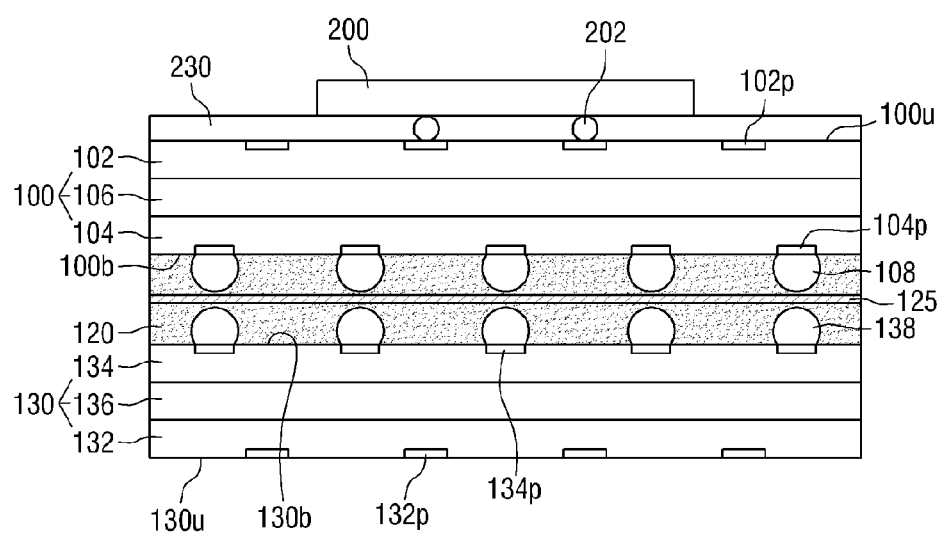

FIGS. 18 and 19 are side views illustrating intermediate process steps to explain a method of fabricating a substrate of a semiconductor package according to another exemplary embodiment of the present general inventive concept.

Referring to FIG. 18, a first lower fixing film 230 may be formed on the first surface 100u of the first wiring substrate 100. The first lower fixing film 230 may be, for example, a non-conductive film (NCF). The first lower fixing film 230 may cover the first bonding finger 102p. When a pressure is applied to the first lower fixing film 230, a portion of the first lower fixing film 230 to which the pressure is applied may be perforated. In FIG. 18, only the first lower fixing film 230 is formed on the first surface 100u, but not limited thereto. Alternatively, a second lower fixing film may also be formed on the third surface 130u.

Referring to FIG. 19, the first lower semiconductor chip 200 may be mounted on the first surface 100u of the first wiring substrate 100. The first lower semiconductor chip 200 may be electrically connected to the first wiring substrate 100 by the first lower solder ball 202. The first lower fixing film 230 is disposed between the first lower solder ball 202 and the first bonding finger 102p. However, when a pressure is applied to the first lower fixing film 230, the first lower fixing film 230 may be perforated. Therefore, when a pressure is applied to the first lower semiconductor chip 200, the first lower solder ball 202 may perforate the first lower fixing film 230. The perforated first lower solder ball 202 may be wetted the first bonding finger 102p by, for example, a reflow process. The first wiring substrate 100 and the first lower semiconductor chip 200 may be electrically connected by the wetting of the first lower solder ball 202 and the first bonding finger 102p.

Subsequent process steps of the semiconductor package fabrication process are substantially the same as those illustrated in FIGS. 9A through 13, and detailed descriptions thereof will be omitted. However, the second lower fixing film, instead of the second lower molding member 262, may also be disposed between the second wiring substrate 130 and the second lower semiconductor chip 250.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a semiconductor package, the method comprising:
providing a substrate of a semiconductor package, including a first wiring substrate having a pad, a first external terminal connected to the pad, a first surface and a second surface facing away from each other, the first surface having a semiconductor chip mounted thereon, a second wiring substrate having a third surface and a fourth surface facing away from each other, and an adhesive film connecting the second surface and the fourth surface;
mounting a first semiconductor chip on the first surface;
mounting a second semiconductor chip on the third surface; and
separating the first wiring substrate and the second wiring substrate having the first semiconductor chip and the second semiconductor chip mounted thereon,
wherein the pad is disposed on the second surface and the first external terminal is disposed within the adhesive film, and
wherein the adhesive film further includes a separator film dividing the adhesive film into two parts.

2. The method of claim 1, further comprising:
forming a first molding member surrounding the first semiconductor chip between the mounting of the first semiconductor chip and the mounting of the second semiconductor chip.

3. The method of claim 2, further comprising:
forming a second molding member surrounding the second semiconductor chip between the mounting of the second semiconductor chip and the separating of the first wiring substrate and the second wiring substrate from each other.

4. The method of claim 1, further comprising:
a second upper molding member surrounding the second semiconductor chip after the separating of the first wiring substrate and the second wiring substrate from each other.

5. The method of claim 4, further comprising:
a second lower molding member filling a portion between the second semiconductor chip and the third surface between the mounting of the second semiconductor chip and the separating of the first wiring substrate and the second wiring substrate from each other.

6. The method of claim 1, wherein the separating of the first wiring substrate and the second wiring substrate from each other comprises separating the adhesive film into a first region and a second region with respect to the separator film.

7. The method of claim 1, wherein the second wiring substrate further includes a second external terminal disposed on the fourth surface.

8. A method of fabricating a semiconductor package, the method comprising:
providing a substrate of a semiconductor package, including a first wiring substrate having a pad, an external terminal connected to the pad, a first surface and a second surface facing away from each other, the first surface having a semiconductor chip mounted thereon, a second wiring substrate having a third surface and a fourth surface facing away from each other, an adhesive film connecting the second surface and the fourth surface, and a support carrier disposed between the second surface and the fourth surface;
mounting a first semiconductor chip on the first surface;
mounting a second semiconductor chip on the third surface; and
separating the first wiring substrate and the second wiring substrate having the first semiconductor chip and the second semiconductor chip mounted thereon,
wherein the pad is disposed on the second surface and the external terminal is disposed within the adhesive film.

9. The method of claim 8, wherein the adhesive film includes an upper adhesive film and a lower adhesive film separated from the upper adhesive film by the support carrier.

10. The method of claim 8, wherein the first wiring substrate is detached from the second wiring substrate at a completion of the separating.

* * * * *